US011316240B2

(12) United States Patent
Chang et al.

(10) Patent No.: US 11,316,240 B2
(45) Date of Patent: Apr. 26, 2022

(54) TRANSITION STRUCTURE FOR COUPLING FIRST AND SECOND TRANSMISSION LINES THROUGH A MULTI-LAYER STRUCTURE AND INCLUDING A CAVITY CORRESPONDING TO THE SECOND TRANSMISSION LINE

(71) Applicant: TMY Technology Inc., Taipei (TW)

(72) Inventors: Su-Wei Chang, Taipei (TW); Chueh-Jen Lin, Taipei (TW); Wen-Tsai Tsai, Taipei (TW); Tzu-Chieh Hung, Taipei (TW); Yang Tai, Taipei (TW); Chien-Tse Fang, Taipei (TW); Po-Chia Huang, Taipei (TW); Tzu-Wen Chiang, Taipei (TW); Shao-Chun Hsu, Taipei (TW); Yu-Cheng Lin, Taipei (TW); Wei-Yang Chen, Taipei (TW)

(73) Assignee: TMY Technology Inc., Taipei (TW)

( * ) Notice: Subject to any disclaimer, the term of this patent is extended or adjusted under 35 U.S.C. 154(b) by 0 days.

(21) Appl. No.: 16/992,170

(22) Filed: Aug. 13, 2020

(65) Prior Publication Data
US 2021/0050643 A1 Feb. 18, 2021

(51) Int. Cl.
*H01P 5/02* (2006.01)
*H01P 3/08* (2006.01)
(Continued)

(52) U.S. Cl.
CPC .............. *H01P 5/028* (2013.01); *H01P 3/082* (2013.01); *H01P 3/088* (2013.01); *H01P 5/02* (2013.01);
(Continued)

(58) Field of Classification Search
CPC .. H01P 5/02; H01P 5/028; H01P 3/082; H01P 3/088; H01P 3/006
(Continued)

(56) References Cited

U.S. PATENT DOCUMENTS

| 6,700,789 B2* | 3/2004 | Shirasaki | ................ H01P 1/047 174/255 |
| 6,856,210 B2* | 2/2005 | Zhu et al. | ............... H01P 3/088 333/246 |

(Continued)

FOREIGN PATENT DOCUMENTS

| CN | 105580195 | 5/2016 |
| CN | 106159404 | 11/2016 |

(Continued)

OTHER PUBLICATIONS

Office Action of Taiwan Counterpart Application, dated Aug. 6, 2021, pp. 1-6.
(Continued)

*Primary Examiner* — Benny T Lee
(74) *Attorney, Agent, or Firm* — JCIPRNET (57) ABSTRACT

A transition structure for millimeter wave is provided. The transition structure includes a first layer signal element coupled to an end of a first transmission line and a plurality of first layer ground elements surrounding the end of the first transmission line equidistantly from the end of the first transmission line and disposed along two opposite sides of a strip body of the first transmission line equidistantly from the strip body of the first transmission line. The transition structure further includes an intermediate layer signal element coupled to the first layer signal element and a plurality of intermediate layer ground elements surrounding the intermediate layer signal element quasi-coaxially. A multilayer transition structure including a multilayer structure and the transition structure is also provided. Therefore, the problem
(Continued)

of operating frequency caused by the thickness of the multilayer structure can be overcome, thereby increasing the resonance frequency of the multilayer structure.

16 Claims, 12 Drawing Sheets

(51) Int. Cl.
  *H01Q 1/22* (2006.01)
  *H01Q 3/26* (2006.01)
  *H01Q 21/00* (2006.01)
  *H01Q 13/02* (2006.01)
  *H01Q 19/185* (2006.01)
  *H01Q 21/29* (2006.01)
  *H04B 17/00* (2015.01)

(52) U.S. Cl.
  CPC ......... *H01Q 1/2283* (2013.01); *H01Q 3/2617* (2013.01); *H01Q 13/02* (2013.01); *H01Q 19/185* (2013.01); *H01Q 21/0025* (2013.01); *H01Q 21/293* (2013.01); *H04B 17/0085* (2013.01)

(58) Field of Classification Search
  USPC .................................................... 333/33, 246
  See application file for complete search history.

(56) References Cited

U.S. PATENT DOCUMENTS

| | | |
|---|---|---|
| 2003/0022652 A1 | 1/2003 | Stepp et al. |
| 2003/0025635 A1 | 2/2003 | Hilgers et al. |
| 2006/0226928 A1* | 10/2006 | Henning et al. ..... H05K 1/0222 333/33 |
| 2014/0262469 A1 | 9/2014 | Hettler et al. |

FOREIGN PATENT DOCUMENTS

| | | |
|---|---|---|
| JP | 2002232143 | 8/2002 |
| WO | 2019079123 | 4/2019 |

OTHER PUBLICATIONS

Office Action of China Counterpart Application, dated Jun. 23, 2021, pp. 1-7.
"Office Action of Japan Counterpart Application", dated Aug. 31, 2021, p. 1-p. 3.
"Notice of Allowance of China Counterpart Application," dated Jan. 6, 2021, pp. 1-4.
Li Yu et al.,"Waveguide-microstrip transition structure of millimeter wave broadband H plane", Electronic Design Engineering, vol. 23, Issue 24, Dec. 2015, with English abstract, pp. 90-92.

* cited by examiner

TRANSITION STRUCTURE FOR COUPLING FIRST AND SECOND TRANSMISSION LINES THROUGH A MULTI-LAYER STRUCTURE AND INCLUDING A CAVITY CORRESPONDING TO THE SECOND TRANSMISSION LINE

BACKGROUND

1. Technical Field

The present disclosure relates to a transition structure and a multilayer transition structure. In particular, the present disclosure relates to a transition structure and a multilayer transition structure for millimeter wave.

2. Description of Related Art

In the current 5G communication era, next generation mobile communication technology plays a key role in various applications such as autonomous vehicles (V2X), edge computing, or artificial intelligence Internet of Things (AIoT). 3GPP Release 15 defines the 5G New Radio (5G NR) mobile communication standard, wherein the frequency spectrum and the millimeter wave frequency bands below 6 GHz are divided into Frequency Ranges 1 (FR1) and Frequency Ranges 2 (FR2). The frequency range of FR1 is 450-6000 MHz, and the frequency range of FR2 is 24250-52600 MHz.

Figure 1A:
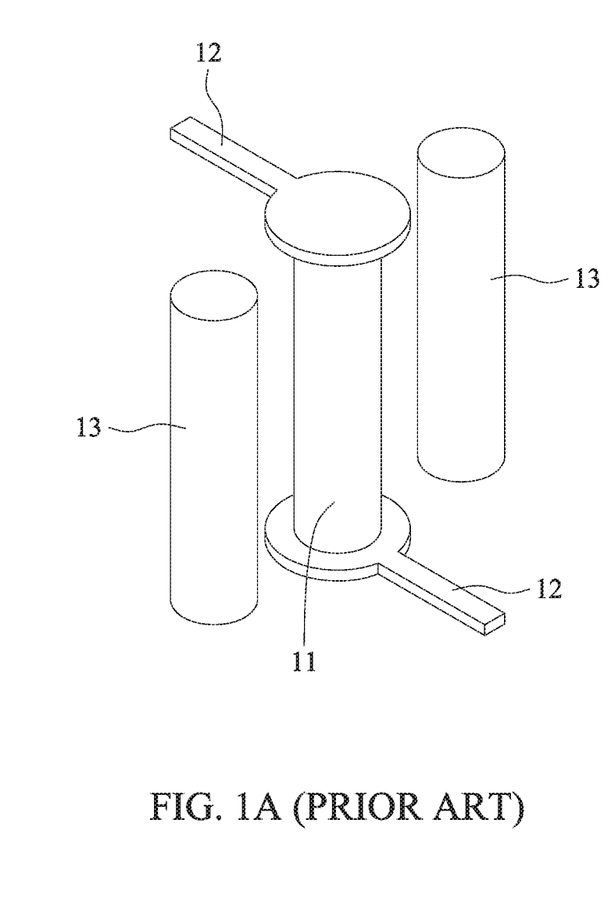
FIGS. 1A and 1B are schematic diagrams of the vertical transition structure in the prior art.
Figure 1B:
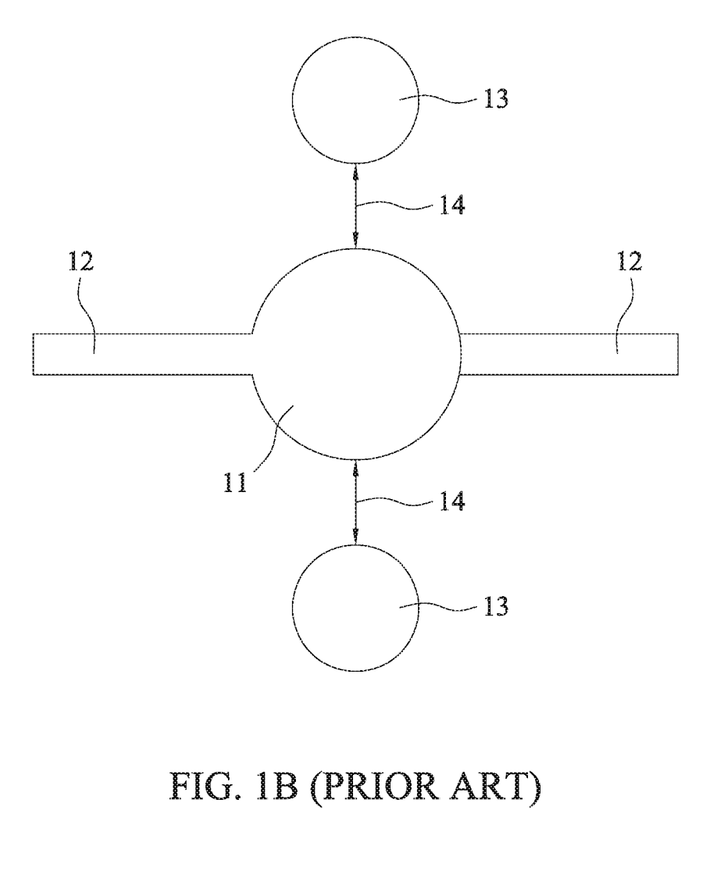

In the prior art, the vertical transition structure for the millimeter wave frequency band is shown in FIG. 1A and FIG. 1B. Generally speaking, the vertical transition structure can be used for the transition in multilayer circuit boards, such as a circuit board with a total thickness of about 1.151 mm. The vertical transition structure may include a signal pin 11 and two ground pins 13, and two transmission lines 12 are respectively coupled to the two ends of the signal pin 11. Generally, the impedance can be changed by adjusting the gaps 14 between the ground pins 13 and the signal pin 11 as shown in FIG. 1B. The smaller the gaps 14, the smaller the impedance. In addition, adjusting the diameter of the signal pin 11 or the ground pins 13 can also change the impedance. The smaller the diameter, the larger the impedance. In addition, adjusting the height of the signal pin 11 or the ground pins 13 can also change the impedance. The smaller the height, the higher the operating frequency.

Figure 1C:
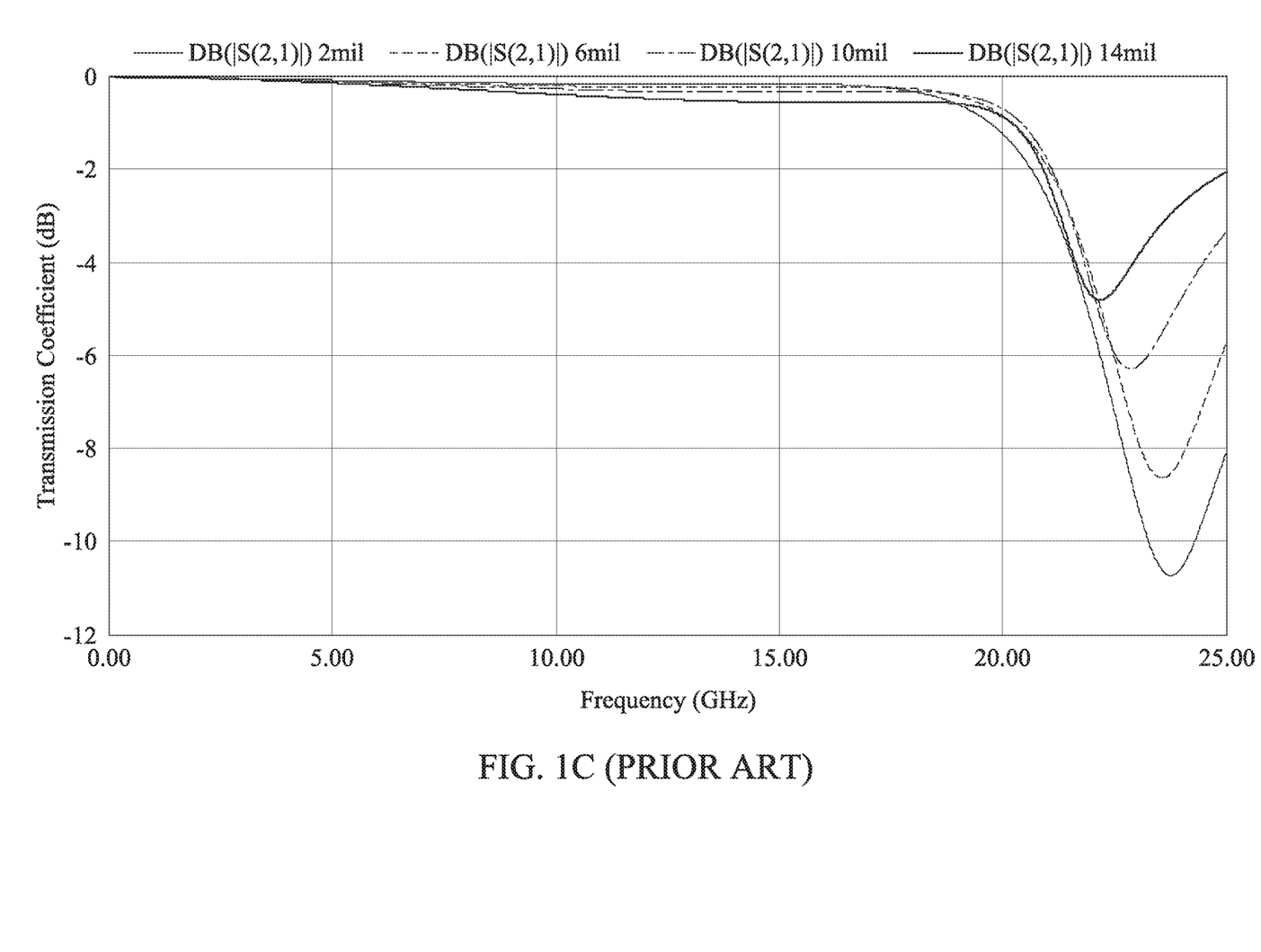
FIG. 1C is a transmission coefficient vs. frequency graph of the vertical transition structure in the prior art.

In other words, in the vertical transition structure, the diameter and the height of the gaps 14 and the pins affect the operating frequency. However, as shown in the transmission coefficient in dB vs. frequency in GHz graph of the vertical transition structure of FIG. 1C, a resonance point is generated near the frequency of 21 GHz. In addition, FIG. 1C shows the transmission coefficient vs. frequency graphs of different gaps. From top to bottom, the gaps are 14 mil, 10 mil, 6 mil and 2 mil, respectively. Insertion loss starts at a frequency of about 20 GHz and reaches a range from 4 to 10 dB at a frequency of about 23 GHz, which impedes the transmission of 5G communications.

Therefore, how to improve the operating frequency of the transition structure while overcoming the influence of the thickness of the circuit board is one of the urgent issues in the art.

SUMMARY OF THE INVENTION

An embodiment of the present disclosure discloses a transition structure for millimeter wave, comprising: a first layer signal element coupled to an end of a first transmission line disposed in a first layer of a multilayer structure; and a plurality of first layer ground elements coupled to the first layer of the multilayer structure and surrounding a strip body and the end of the first transmission line.

The present disclosure discloses a multilayer transition structure for millimeter wave, comprising: a multilayer structure comprising a first layer having a first transmission line; and a transition structure comprising a first layer signal element and a plurality of first layer ground elements, wherein the first layer signal element is coupled to the first layer of the multilayer structure, wherein the first layer signal element is coupled to an end of the first transmission line, and wherein the plurality of first layer ground elements surround a strip body and the end of the first transmission line.

BRIEF DESCRIPTION OF THE DRAWINGS

The present disclosure can be more fully understood by reading the following descriptions of the embodiments, with reference to the accompanying drawings.

DETAILED DESCRIPTION OF THE INVENTION

The following embodiments illustrate the implementation of the present disclosure. Those skilled in the art can easily understand the other advantages and effects of the present disclosure based on the contents disclosed in this specification. The structures, ratios, sizes, etc., shown in the drawings accompanying this specification are for illustrating the contents disclosed in the specification for the understanding and reading of those skilled in the art, and are not meant to limit the implementation of the present disclosure. Therefore, any modification, change or adjustment, without affecting the effects that the present disclosure can produce and the objectives that the present disclosure can achieve, shall still fall within the scope that can be covered by the technical contents disclosed in the present disclosure.

Figure 2:
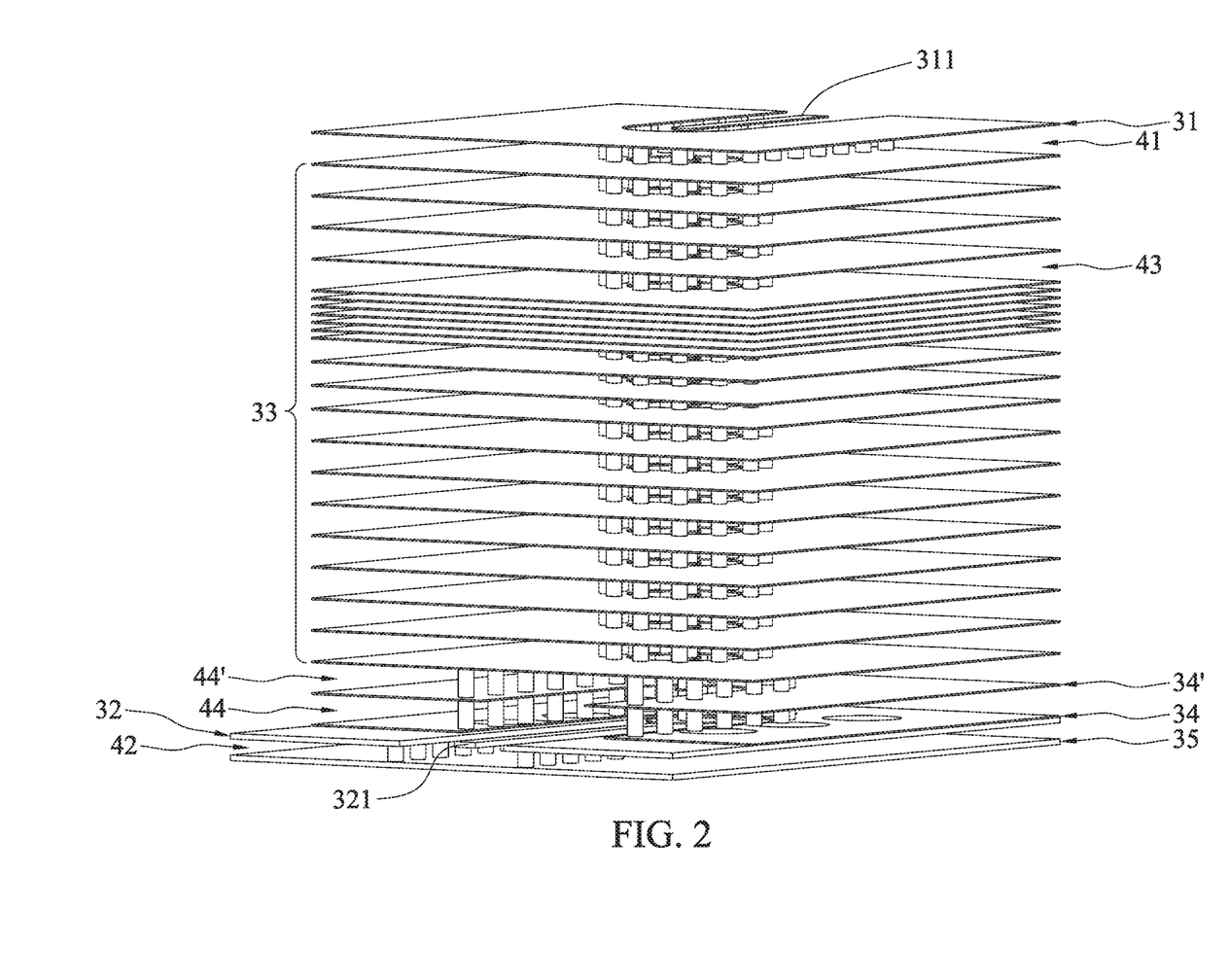
FIG. 2 is a three-dimensional schematic diagram of a multilayer structure and a transition structure for millimeter wave of the present disclosure.
Figure 3:
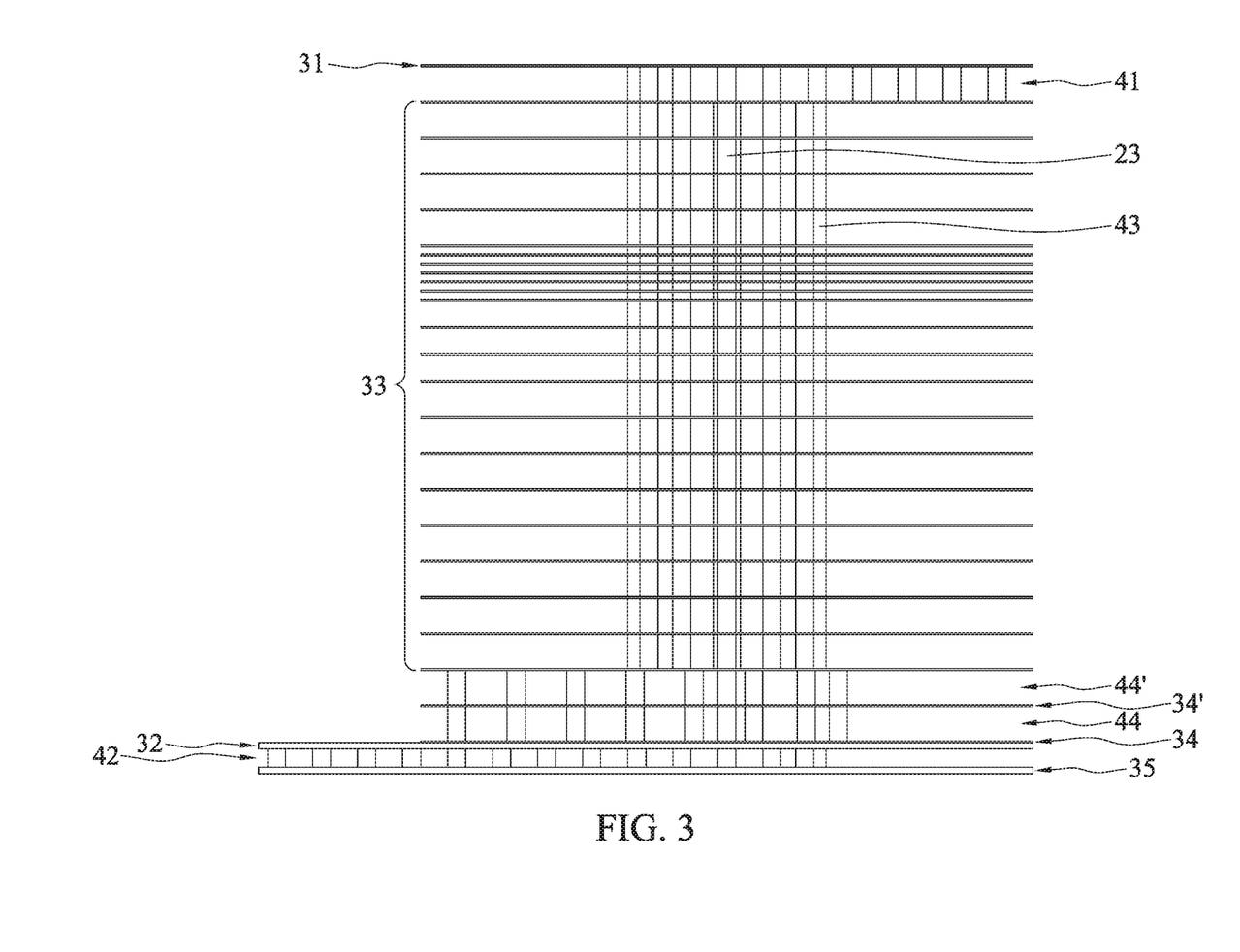
FIG. 3 is a schematic side view of a multilayer structure and a transition structure for millimeter wave of the present disclosure.

Please refer to FIGS. 2 and 3 showing a multilayer structure for millimeter wave of the present disclosure. FIGS. 2 and 3 show a 26-layer multilayer structure with a total thickness of about 3.95 mm. A bottom plate 35 (FIG. 2, FIG. 3 and FIG. 5) carries the multilayer structure disposed thereon. A packaging material (not shown) can be used to fill the spaces between the layers of the multilayer structure and between the multilayer structure and the bottom plate 35. It should be noted that the specific implementation does not limit the number of layers, thickness or materials. The multilayer structure mainly includes a first layer 31, a second layer 32, one or more intermediate layers 33 between the first layer 31 and the second layer 32, and one or more third layers 34, 34' between the first layer 31 and the second layer 32. In addition, the thickness of the first layer 31 and the second layer 32 can be thinner than that of the intermediate layer 33, which is about 0.1 to 0.2 mm, depending on requirement or impedance.

Please refer to FIG. 3. The transition structure of the present disclosure includes a first layer signal element 21 (see FIG. 4 for details), a plurality of first layer ground elements 41 (FIG. 2 and FIG. 3) surrounding the first layer signal element 21, a plurality of second layer ground elements 42 (FIG. 2 and FIG. 3), an intermediate layer signal element 23 coupled to the first layer signal element 21, a plurality of intermediate layer ground elements 43 (FIG. 2 and FIG. 3) surrounding the intermediate layer signal element 23, third layer signal elements 24, 24' coupled to the first layer signal element 21 (refer to FIG. 6D for details), and a plurality of third layer ground elements 44, 44' FIG. 2 and FIG. 3) surrounding the third layer signal elements 24, 24'. It should be noted that the meaning of "coupled" in this specification can be the same as that of "electrically connected," that is, no matter whether it is a direct or indirect connection relationship in structure, there is an electrical signal transmission between the structures.

Figure 4:
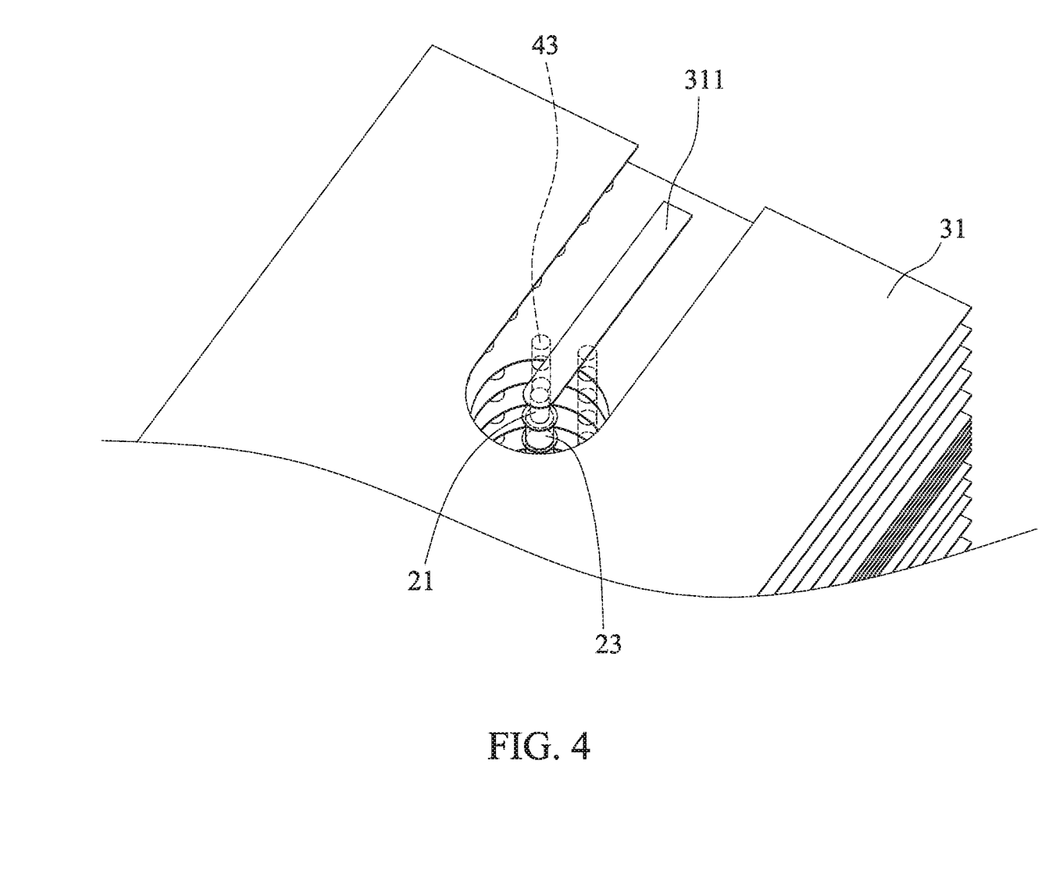
FIG. 4 is a partial enlarged view of a multilayer structure and a transition structure for millimeter wave of the present disclosure.
Figure 5:
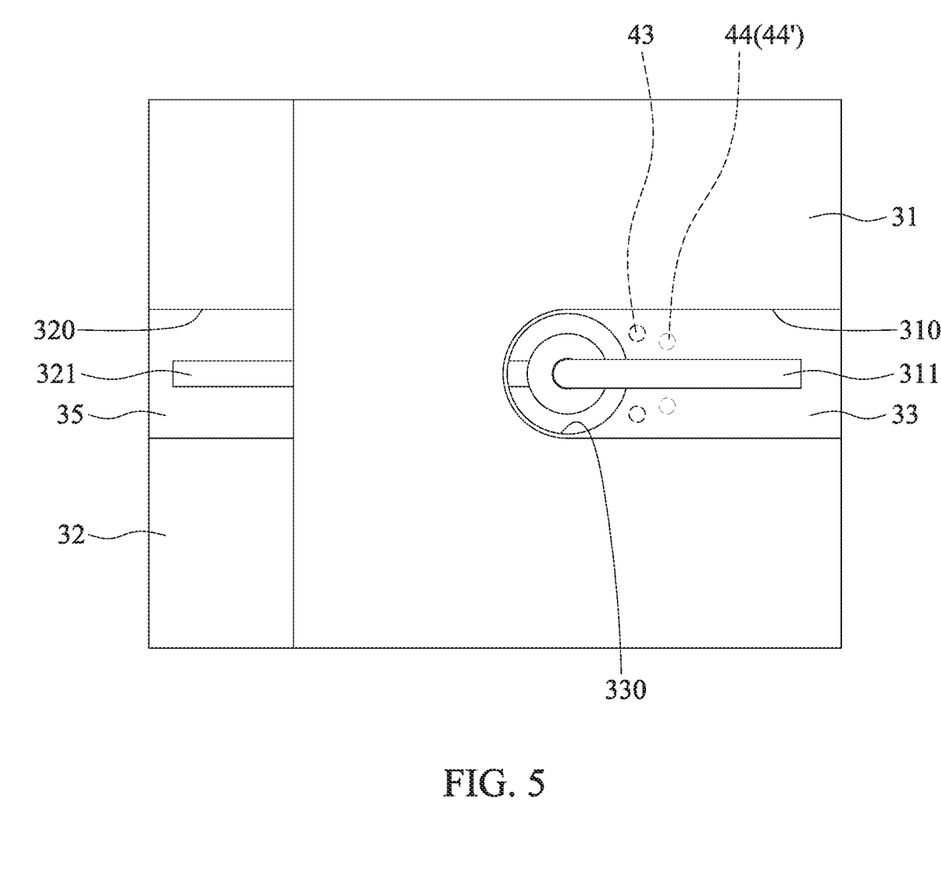
FIG. 5 is a schematic top view of a multilayer structure and a transition structure for millimeter wave of the present disclosure.

Please refer to FIGS. 4 and 5. FIG. 4 is a partial enlarged view of FIG. 2, and FIG. 5 is a top view of the first layer 31 in FIG. 2. The first layer signal element 21 (FIG. 4), the intermediate layer signal element 23 (FIG. 4), and the third layer signal elements 24, 24' (FIG. 6D) are coupled in series. In addition, the first layer signal element 21 is coupled to a first transmission line 311 (FIG. 2, FIG. 4 and FIG. 5) in the first layer 31. The first layer 31 forms a first cavity 310 (FIG. 5) matching the strip shape of the first transmission line 311 to accommodate the first transmission line 311. The first layer signal element 21 is coupled to a second transmission line 321 (FIG. 2, FIG. 4 and FIG. 5) in the second layer 32 as shown in FIG. 5 via the intermediate layer signal element 23 or further via the third layer signal elements 24, 24'. The second layer 32 forms a second cavity 320 (FIG. 5) matching the strip shape of the second transmission line 321 to accommodate the second transmission line 321. In addition, the first transmission line 311 and the second transmission line 321 extend in opposite directions, so the first cavity 310 and the second cavity 320 open in opposite directions. Generally, the width of the first transmission line 311 is related to the thickness of the first layer 31, and the width of the second transmission line 321 is related to the thickness of the second layer 32.

Next, please refer to FIGS. 6A to 6D, which are bottom views of the first layer 31 (FIG. 6A), the second layer 32 (FIG. 6B), the intermediate layer 33 (FIG. 5 and FIG. 6C) and the third layer 34, 34' (FIG. 6D) in FIG. 2, schematically showing the configuration of the signal elements and the ground elements of each layer.

Figure 6A:
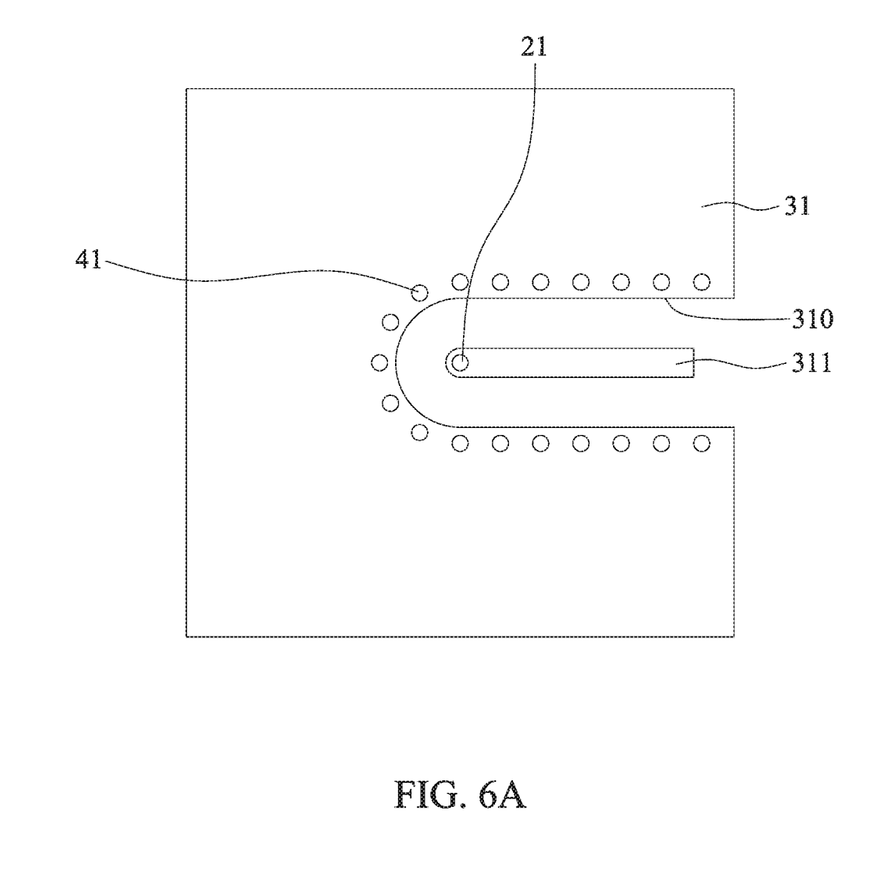
FIGS. 6A, 6B, 6C and 6D are schematic diagrams of the first layer, the second layer, the intermediate layer and the third layer, respectively of a multilayer structure and a transition structure for millimeter wave of the present disclosure.

As shown in FIG. 6A, the first layer signal element 21 is coupled to an end of the first transmission line 311. The plurality of first layer ground elements 41 surround the first transmission line 311 on the first layer 31. The first layer ground elements 41 are equidistantly spaced. In detail, a plurality of first layer ground elements 41 surround an end of the first transmission line 311 equidistantly from the end of the first transmission line 311, that is, a part of the plurality of first layer ground elements 41 surrounds the first layer signal element 21 and forms a half circle with the first layer signal element 21 as the center of the half circle. Moreover, a part of the plurality of first layer ground elements 41 is arranged along two opposite sides of the strip body of the first transmission line 311 equidistantly from the strip body of the first transmission line 311. The distance between the first layer ground elements 41 and the strip body of the first transmission line 311 is determined based on straight line distance. Furthermore, the plurality of first layer ground elements 41 are arranged along the edge of the first cavity 310 equidistantly from the edge of the first cavity 310, wherein the first cavity 310 is formed based on the strip shape of the first transmission line 311, so the edge of the first cavity 310 is equidistant from the whole of the first transmission line 311.

Figure 6B:
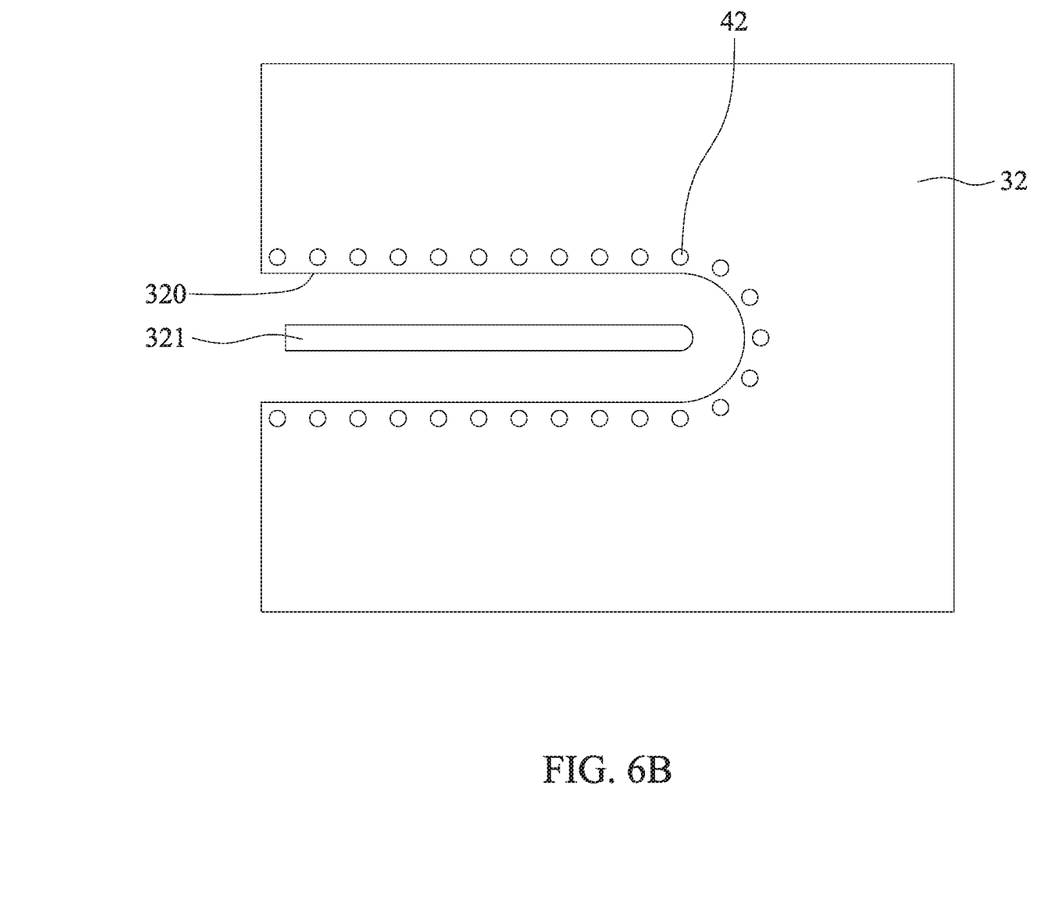

As shown in FIG. 6B, an end of the second transmission line 321 is coupled to the first layer signal element 21 as shown in FIG. 6A. The plurality of second layer ground elements 42 surround the second transmission line 321 on the second layer 32. The second layer ground elements 42 are equidistantly spaced. In detail, a plurality of second layer ground elements 42 surround an end of the second transmission line 321 equidistantly from the end of the second transmission line 321, that is, a part of the plurality of second layer ground elements 42 surrounds an end of the second transmission line 321 and forms a half circle with the end of the second transmission line 321 as the center of the half circle. Moreover, a part of the plurality of second layer ground elements 42 is arranged along two opposite sides of the strip body of the second transmission line 321 equidistantly from the strip body of the second transmission line 321. The distance between the second layer ground elements 42 and the strip body of the second transmission line 321 is determined based on straight line distance. Furthermore, the plurality of second layer ground elements 42 are arranged along the edge of the second cavity 320 equidistantly from the edge of the second cavity 320, wherein the second cavity 320 is formed based on the strip shape of the second transmission line 321, so the edge of the second cavity 320 is equidistant from the whole of the second transmission line 321.

Please refer to FIG. 6A together with FIG. 6B. The axis line connecting the end of the first transmission line 311 (FIG. 6A) and the end of the second transmission line 321 (FIG. 6B) passes through the first layer signal element 21 (FIG. 6A). The two half circles of the axis line are respectively surrounded by the first layer ground elements 41 (FIG. 6A) and the second layer ground elements 42 (FIG. 6B) on different layers. In other words, the plurality of first layer ground elements 41 combined with the plurality of second layer ground elements 42 collectively surround the first layer signal element 21, forming a complete circle around the first layer signal element 21. In addition, the first transmission line 311 and the second transmission line 321 extend in opposite directions, so the first cavity 310 (FIG. 6A) and the second cavity 320 (FIG. 6B) open in opposite directions. The distance between the edges of the first cavity 310 on both sides of the strip body of the first transmission line 311 may be equal to the distance between the edges of the second cavity 320 on both sides of the strip body of the second transmission line 321. In addition, the number of the first layer ground elements 41 and the number of the second layer ground elements 42 may be equal, that is, the part of the second layer ground elements 42 in the area of the second layer 32 (FIG.6B) surpassing the first layer 31 (FIG. 6A) can be omitted, that is, the number of the first layer ground elements 41 may be 19 and the number of the second layer ground elements 42 may be also 19. Of course, the present disclosure does not limit that number, and that number depends on the specific implementation or requirements.

Therefore, with the configuration of the first layer signal element, the plurality of first layer ground elements, and the plurality of second layer ground elements of the present disclosure, the transition structure of the present disclosure can achieve the effect of increasing the operating frequency.

Figure 6C:
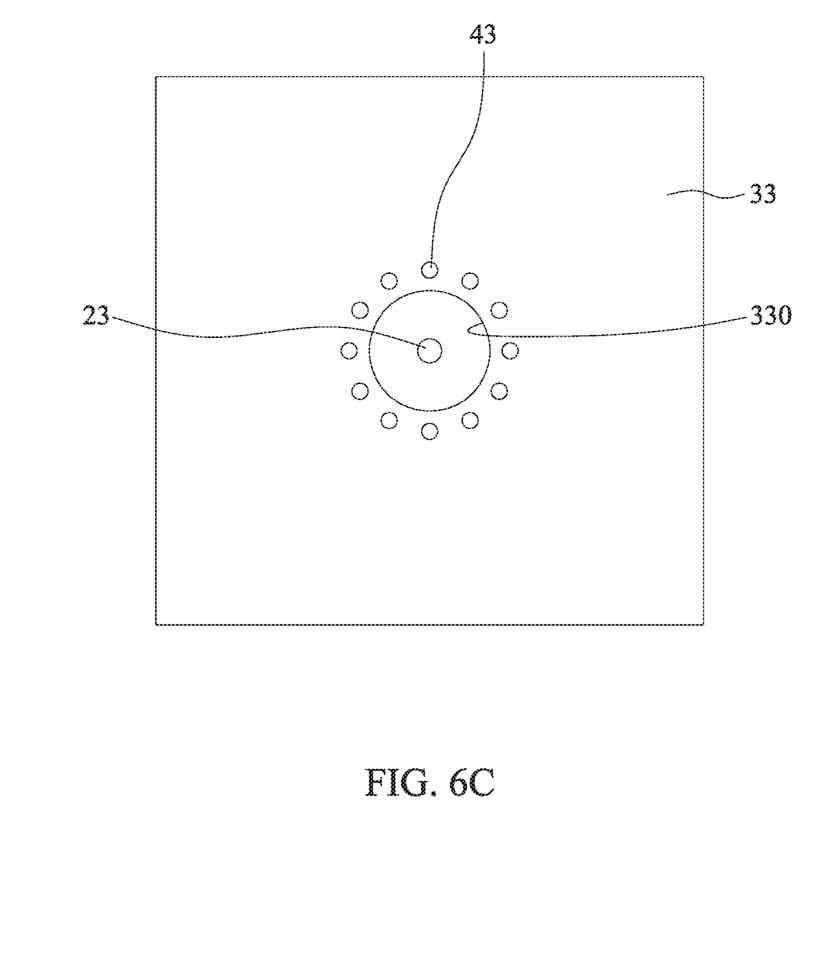

As shown in FIG. 6C, the intermediate layer signal element 23 is coupled to the first layer signal element 21 as shown in FIG. 6A. A plurality of intermediate layer ground elements 43 (FIG. 4, FIG. 5 and FIG. 6C) surround the intermediate layer signal element 23 quasi-coaxially on the intermediate layer 33. The plurality of intermediate layer ground elements 43 are equidistantly spaced. In addition, the intermediate layer 33 forms an intermediate cavity 330 (FIG. 5 and FIG. 6C) for the intermediate layer signal element 23 to pass through, wherein the plurality of intermediate layer ground elements 43 are arranged along the edge of the intermediate cavity 330 equidistantly from the edge of the intermediate cavity 330. It should be noted that FIG. 6C schematically shows one of the intermediate layers 33 in FIG. 2 and FIG. 3, and the number of the intermediate layers 33 can be determined according to requirements in a specific implementation.

Please refer to FIG. 6A together with FIG. 6C. The plurality of intermediate layer ground elements 43 (FIG. 6C) surround the first layer signal element 21 (FIG. 6A) quasi-coaxially. Therefore, with the configuration of the first layer signal element, the plurality of the first layer ground elements, the intermediate layer signal element, and the plurality of intermediate layer ground elements of the present disclosure, the transition structure of the present disclosure can achieve the effect of increasing the operating frequency.

Figure 6D:
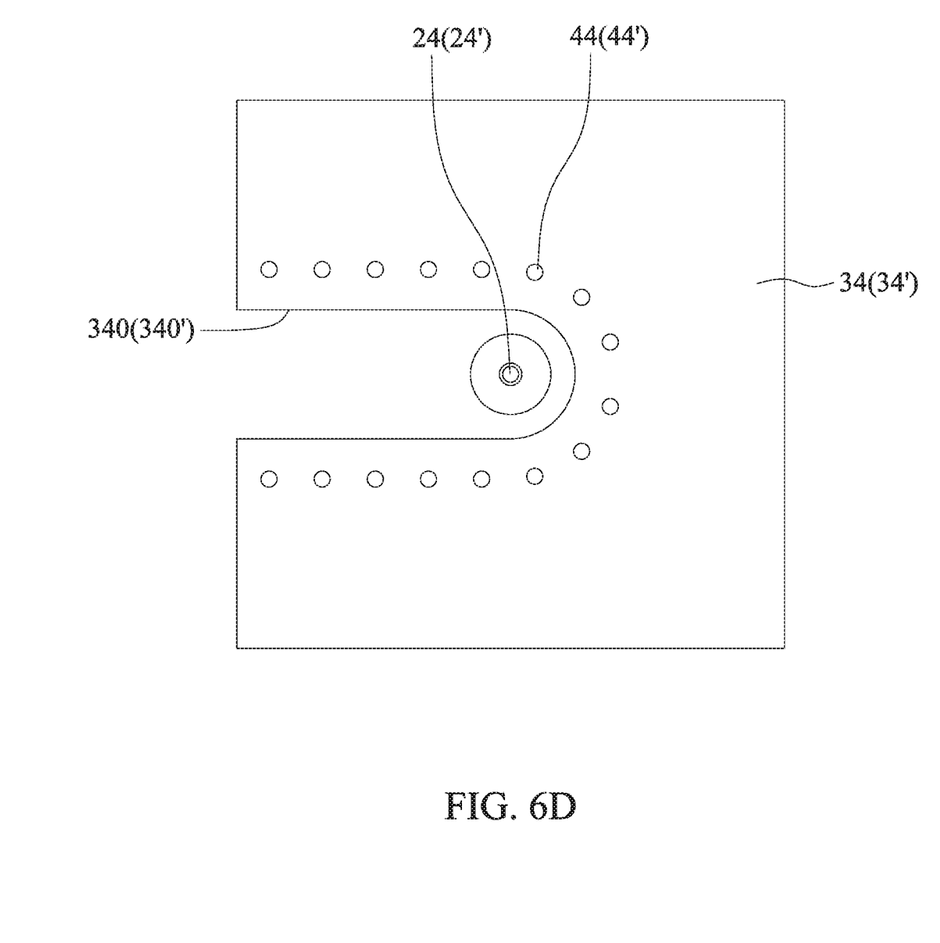

As shown in FIG. 6D, the third layer signal elements 24, 24' are coupled to the first layer signal element 21 (FIG. 6A) for example via the intermediate layer signal elements 23 (FIG. 6C). A plurality of third layer ground elements 44, 44' (FIG. 5 and FIG. 6D) are arranged along the edges of the third cavities 340, 340' equidistantly from the edges of the third cavities 340, 340'. The third cavities 340, 340' correspond to the shape of the second transmission line 321 but are slightly larger than the second cavity 320, and open in the same direction as the second cavity 320. It should be noted that the third layer 34 or 34' has basically the same structure. The number of the third layers can be determined according to requirements in a specific implementation. By designing the third layers 34, 34' and the third cavities 340, 340' between the first layer 31 and the second layer 32, the impedance generated by each layer can be adjusted.

In addition, the aforementioned first layer signal element 21 (FIG. 6A), the intermediate layer signal elements 23 (FIG. 6C), and the third layer signal elements 24, 24' (FIG. 6D) may be, for example, signal vias or signal via holes. The aforementioned plurality of first layer ground elements 41, the second layer ground elements 42 (FIG. 6B), the intermediate layer ground elements 43 (FIG. 6C), and the third layer ground elements 44, 44' (FIG. 6D) may be, for example, ground vias or ground via holes.

Figure 7:
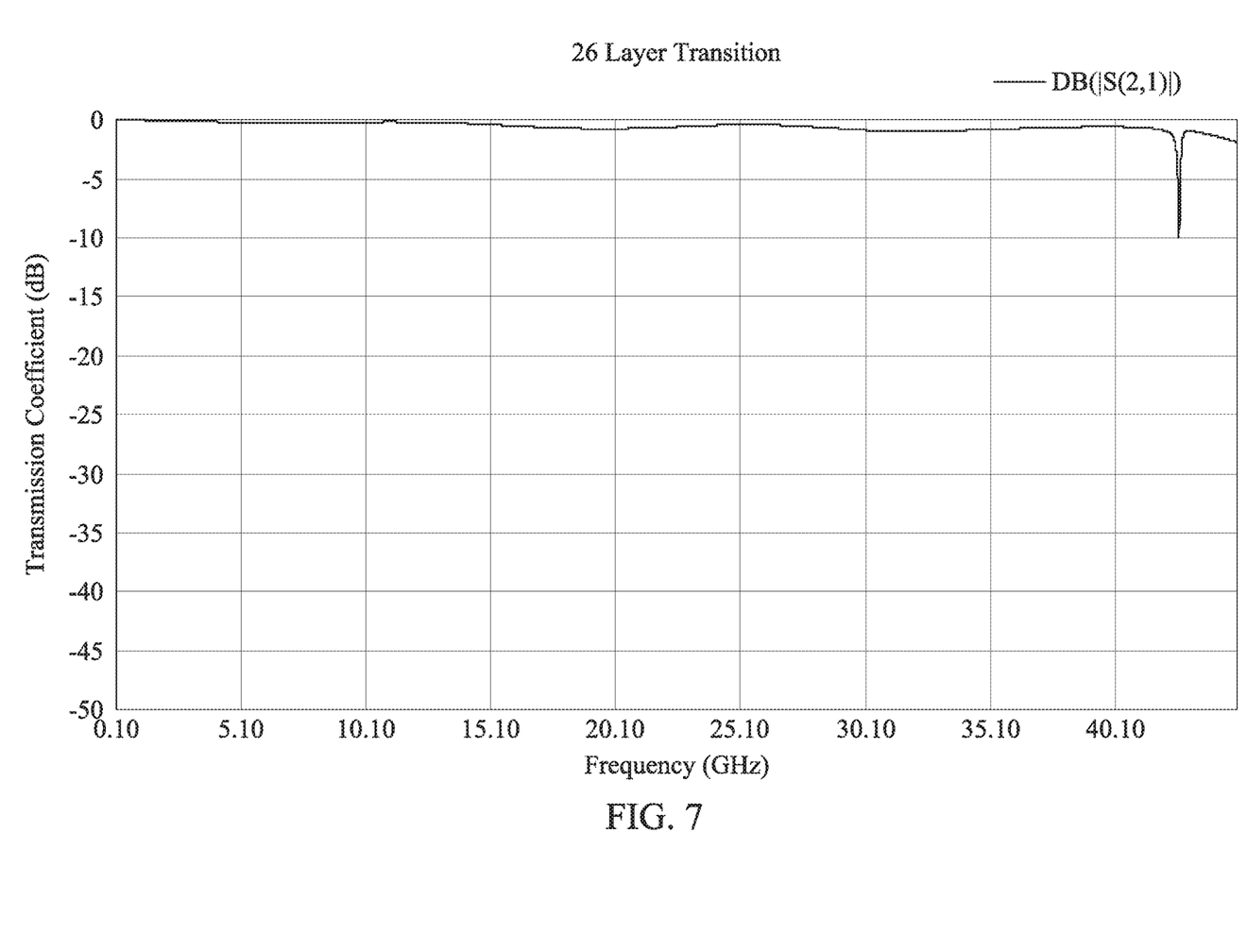
FIG. 7 is a transmission coefficient vs. frequency graph of a multilayer structure and a transition structure for millimeter wave of the present disclosure.

Please refer to FIG. 7. Below about 42 GHz, the forward transmission coefficient S21 in the S parameters in dB vs. frequency in GHz has an insertion loss of about 0.04 dB to 1 dB, which indicates that the insertion losses of the process of signal transmission from port 1 to port 2 is very small, and there is a larger insertion loss at around 42-43 GHz. In other words, using the 26-layer transition structure of the present disclosure, the resonance frequency can be increased to about 42.66 GHz, which can reach higher frequencies than the prior art.

In summary, the transition structure and the multilayer transition structure for millimeter wave of the present disclosure can adapt and connect a microstrip line (ML) to a planar array grid. Through the first layer signal element and the plurality of first layer ground elements surrounding the half circle around the first layer signal element, the plurality of second layer ground elements surrounding the other half circle around the first layer signal element, and/or the intermediate layer signal element and the plurality of ground elements surrounding the intermediate layer signal element quasi-coaxially, the transition structure and the multilayer transition structure for millimeter wave of the present disclosure can reduce the influence of the thickness of the multilayer structure on the operating frequency, thereby increasing the resonance frequency.

The aforementioned embodiments illustrate the effect of the present disclosure, and are not meant to limit the present disclosure. Anyone skilled in the art can modify or change the aforementioned embodiments provided that the spirit and scope of the present disclosure are not violated. Therefore, the protection scope of the present disclosure should be as recited in the following claims.

What is claimed is:

1. A transition structure for millimeter wave, comprising:
 a first layer signal element coupled to an end of a first transmission line disposed in a first layer of a multilayer structure; and
 a plurality of first layer ground elements coupled to the first layer of the multilayer structure and surrounding a strip body of the first transmission line and the end of the first transmission line;
 a plurality of second layer ground elements coupled to a second layer of a second transmission line in the multilayer structure, wherein the plurality of second layer ground elements surround a strip body of the second transmission line and an end of the second transmission line, and wherein the end of the second transmission line is coupled to the first layer signal element;
 a third layer signal element coupled to the first layer signal element; and
 a plurality of third layer ground elements coupled to a third layer between the first layer and the second layer in the multilayer structure, the third layer having a third cavity corresponding to the second transmission line, wherein the plurality of third layer ground elements are arranged along an edge of the third cavity.

2. The transition structure of claim 1, wherein a part of the plurality of first layer ground elements surrounds the end of the first transmission line equidistantly from the end of the first transmission line, and wherein another part of the plurality of first layer ground elements is arranged along two opposite sides of the strip body of the first transmission line equidistantly from the strip body of the first transmission line.

3. The transition structure of claim 1, wherein the first layer signal element is a signal via or a signal via hole, and wherein the plurality of first layer ground elements are ground vias or ground via holes.

4. The transition structure of claim 1, wherein a part of the plurality of second layer ground elements surrounds the end of the second transmission line equidistantly from the end of the second transmission line, and wherein another part of the plurality of second layer ground elements is arranged along two opposite sides of the strip body of the second transmission line equidistantly from the strip body of the second transmission line.

5. The transition structure of claim 1, wherein the first transmission line and the second transmission line extend in opposite directions, wherein an axis line connecting the end of the first transmission line and the end of the second transmission line passes through the first layer signal element, and wherein the plurality of first layer ground elements and the plurality of second layer ground elements collectively surround the first layer signal element.

6. The transition structure of claim 1, further comprising:
an intermediate layer signal element coupled to the first layer signal element; and
a plurality of intermediate layer ground elements coupled to an intermediate layer between the first layer and the second layer in the multilayer structure, wherein the plurality of intermediate layer ground elements surround the intermediate layer signal element quasi-coaxially.

7. The transition structure of claim 1, wherein the plurality of third layer ground elements are arranged along the edge of the third cavity equidistantly from the edge of the third cavity.

8. A multilayer transition structure for millimeter wave, comprising:
a multilayer structure comprising a first layer having a first transmission line, a second layer having a second transmission line and a third layer between the first layer and the second layer, wherein the third layer has a third cavity corresponding to the second transmission line; and
a transition structure comprising a first layer signal element, a plurality of first layer ground elements, a plurality of second layer ground elements coupled to the second layer of the multilayer structure, a third layer signal element and a plurality of third layer ground elements, wherein the first layer signal element is coupled to the first layer of the multilayer structure, wherein the first layer signal element is coupled to an end of the first transmission line, and wherein the plurality of first layer ground elements surround a strip body and the end of the first transmission line, wherein the second transmission line is coupled to the first layer signal element, the plurality of second layer ground elements surround a strip body of the second transmission line and an end of the second transmission line, wherein the third layer signal element is coupled to the first layer signal element, and wherein the plurality of third layer ground elements are arranged along an edge of the third cavity.

9. The multilayer transition structure of claim 8, wherein the first layer signal element is a signal via or a signal via hole, and wherein the plurality of first layer ground elements are ground vias or ground via holes.

10. The multilayer transition structure of claim 8, wherein the first layer of the multilayer structure forms a first cavity for accommodating the first transmission line, and wherein the plurality of first layer ground elements are arranged along an edge of the first cavity equidistantly from the edge of the first cavity.

11. The multilayer transition structure of claim 8, wherein a part of the plurality of first layer ground elements surrounds the end of the first transmission line equidistantly from the end of the first transmission line, and wherein another part of the plurality of first layer ground elements is arranged along two opposite sides of the strip body of the first transmission line equidistantly from the strip body of the first transmission line.

12. The multilayer transition structure of claim 8, wherein the multilayer structure comprises an intermediate layer between the first layer and the second layer, wherein the transition structure comprises an intermediate layer signal element and a plurality of intermediate layer ground elements, wherein the intermediate layer signal element is coupled to the first layer signal element, and wherein the plurality of intermediate layer ground elements surround the intermediate layer signal element quasi-coaxially.

13. The multilayer transition structure of claim 8, wherein a part of the plurality of second layer ground elements surrounds the end of the second transmission line equidistantly from the end of the second transmission line, and wherein another part of the plurality of second layer ground elements is arranged along two opposite sides of the strip body of the second transmission line equidistantly from the strip body of the second transmission line.

14. The multilayer transition structure of claim 8, wherein the first transmission line and the second transmission line extend in opposite directions, wherein an axis line connecting the end of the first transmission line and the end of the second transmission line passes through the first layer signal element, and wherein the plurality of first layer ground elements and the plurality of second layer ground elements collectively surround the first layer signal element.

15. The multilayer transition structure of claim 8, wherein the second layer of the multilayer structure forms a second cavity for accommodating the second transmission line, and wherein the plurality of second layer ground elements are arranged along an edge of the second cavity equidistantly from the edge of the second cavity.

16. The multilayer transition structure of claim 8, wherein the plurality of third layer ground elements are arranged along the edge of the third cavity equidistantly from the edge of the third cavity.

* * * * *